United States Patent [19]

Huseby

[11] 4,240,828
[45] Dec. 23, 1980

[54] METHOD FOR MINIMIZING THE FORMATION OF A METAL-CERAMIC LAYER DURING CASTING OF SUPERALLOY MATERIALS

[75] Inventor: Irvin C. Huseby, Schenectady, N.Y.

[73] Assignee: General Electric Company, Schenectady, N.Y.

[21] Appl. No.: 80,285

[22] Filed: Oct. 1, 1979

Related U.S. Application Data

[63] Continuation-in-part of Ser. No. 847,778, Nov. 2, 1977, abandoned.

[51] Int. Cl.³ .............................................. C22C 19/00
[52] U.S. Cl. ........................................ 75/135; 75/171; 164/138
[58] Field of Search .................... 75/171, 135; 164/138

[56] References Cited

U.S. PATENT DOCUMENTS

| | | |
|---|---|---|
| 3,972,367 | 8/1976 | Gigliotti, Jr. et al. ............... 164/138 |
| 4,031,945 | 6/1977 | Gigliotti, Jr. et al. ............... 164/138 |
| 4,039,330 | 8/1977 | Shaw ..................................... 75/171 |

Primary Examiner—M. J. Andrews
Attorney, Agent, or Firm—Jane M. Binkowski; James C. Davis, Jr.; Leo I. MaLossi

[57] ABSTRACT

A method for minimizing the formation of a reaction layer at the metal-ceramic interface comprises doping a superalloy material with the rare earth metal whose metal cation is in the ceramic material comprising the mold and/or core used in casting and directionally solidifying the superalloy material.

7 Claims, 1 Drawing Figure

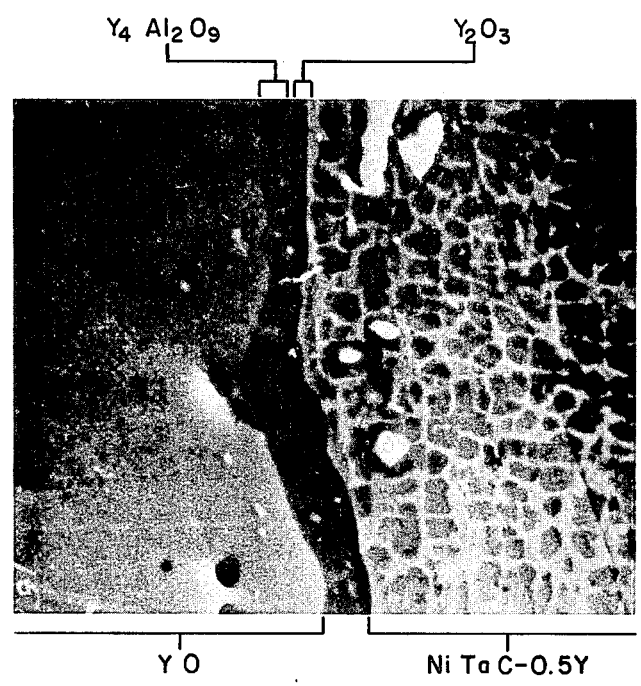

METHOD FOR MINIMIZING THE FORMATION OF A METAL-CERAMIC LAYER DURING CASTING OF SUPERALLOY MATERIALS

CROSS-REFERENCE TO RELATED PATENT APPLICATION

This application is a continuation-in-part of my copending application Ser. No. 847,778, filed on Nov. 2, 1977, now abandoned.

BACKGROUND OF THE INVENTION

1. Field of the Invention

This invention relates to the minimizing of metal-mold reactions between cast superalloy and directionally solidified eutectic materials and cores/or molds employed therewith.

2. Description of the Prior Art

The production of directionally solidified (DS) metal eutectic alloys and superalloys for high pressure turbine (HPT) airfoils with intricate internal passageways for air cooling requires that the core and mold not only be dimension-alloy stable and sufficiently strong to contain and shape the casting but also be sufficiently crushable to prevent mechanical rupture (hot cracking) of the casting during solidification and cooling. The DS process requirements of up to 1875° C. for a 16 hr. time period imposes severe constraints on materials which may serve as mold or core candidates.

The prior art appears to be mostly limited to the use of silica or silica-zircon core and mold materials. At temperatures greater than 1600° C. the silica based materials fail from the standpoint of both mechanical integrity and chemical incompatibility with the advanced alloy compositions.

Dimensional control of the silica core is excellent since cristobalite exhibits very little densification. Microstructural examination reveals that, in some cases, commercial core compositions employ very large particles ($>100$ μm). The addition of large particles serves to lower both shrinkage and mechanical strength.

Paul S. Svec in "Process For Making An Investment Mold For Casting And Solidification Of Superalloys Therein", Ser. No. 590,970, teaches the use of alumina-silica compositions for making molds and cores. Charles D. Grekovich and Michael F. X. Gigliotti, Jr. in U.S. Pat. Nos. 3,955,616, 3,972,367, and 4,031,945 teach cores and molds of alumina-silica, yttria-silica, and magnesium-silica compositions which have a barrier layer formed at the mold/metal interface. In particular they discuss alumina barrier layers. One possible means for the formation of their alumina layer is by a chemical reaction wherein carbon of the susceptor chemically reduces the material composition of the mold or core. It is also taught that when other alloys not having aluminum therein may be cast in their molds provided they contain such materials as magnesium, yttrium, hafnium, zirconium and titanium, therein.

When a rare-earth doped NiTaC-13 alloy which contain aluminum in its compositions, was cast in an alumina-silica mold, a severe metal-mold reaction occurred which caused severe surface defects in the surface of the casting.

Charles D. Greskovich, Ser. No. 698,909, also teaches an alumina-silica composition wherein the material is of a predetermined size so as to favor, and therefore enable, the formation of metastable mullite for molds and cores which exhibit superior sag resistance at high temperatures.

Aluminum oxide ($Al_2O_3$) by itself, without a chemical or physical binder material, has been identified as a potential core and mold material based on both chemical compatibility and leachability considerations. Aluminum oxide, or alumina doped with rare earth oxides has also been proposed as suitable core and mold materials for casting and solidifying the same superalloy materials. Some oxide ceramics have a free energy of formation that is much more negative than that of $Al_2O_3$ and yet react with the aluminum of a superalloy material such as NiTaC-13 and the like. Such a reaction results in the formation of a mixed oxide layer at the metal-ceramic interface. In particular when $Y_2O_3$ is the ceramic material in contact with the molten metal NiTaC-13, the double oxides $Y_3Al_5O_{12}$, $YAlO_3$ and $Y_4Al_2O_9$ are formed at the metal-ceramic interface when $Y_2O_3$ reacts with molten metal. Such a reaction layer is undesirable for several reasons including:

1. Such a mixed oxide layer which forms during directional solidification has an irregular surface morphology. Removal of the mixed oxide layer results in a rough metal finish for the casting and loss of dimensional tolerances.

2. The reaction layer is usually very difficult to leach from the casting by the autoclave caustic leaching process.

3. The reaction layer does not appear to dissolve in mineral acids.

Therefore, it is an object of this invention to provide a new and improved method for minimizing the formation of a reaction layer at the metal-ceramic interface when a superalloy is cast and directionally solidified.

Another object of this invention is to provide a new and improved method for minimizing the formation of a reaction layer at the metal-ceramic interface by doping a superalloy material with a rare earth metal whose metal cation is in the ceramic oxide material comprising the mold and/or core.

Other objects of this invention will, in part, be obvious and will, in part, appear hereinafter.

BRIEF DESCRIPTION OF THE INVENTION

In accordance with the teachings of this invention there is provided a new and improved method for minimizing the formation of a reaction layer at the metal-ceramic oxide interface during casting and directional solidification of superalloy materials. A superalloy material is prepared and then doped with less than 3 weight percent of a rare earth metal. The rare earth metal is one selected from the group consisting of Y, Sm, Nd, Gd, Dy, Er and Yb. The doped superalloy material is cast and directionally solidified in contact with a ceramic oxide material containing less than 1 percent by weight silica therein. The same rare earth metal present as the dopant material in the superalloy material is the metal cation present in the ceramic material.

Preferably, less than 1 weight percent of the rare earth metal is used as a dopant material. Yttrium is the preferred dopant metal for NiTaC-13 alloy cast in contact with yttria ceramic material.

BRIEF DESCRIPTION OF THE FIGURE

The FIGURE is a scanning electron micrograph, at 5000 x, of a section of NiTaC-13 - 0.5Y alloy cast in contact with $Y_2O_3$ ceramic material.

DESCRIPTION OF THE INVENTION

The addition of a small amount of a rare earth metal to a directionally solidifiable eutectic alloy or a superalloy material minimizes, or substantially prevents, the formation of a mixed oxide layer at the metal-ceramic interface during casting and solidification. The rare earth metal added to the alloy material composition is the same as the rare earth metal comprising the ceramic material for making the casting and/or core employed in casting and solidifying the alloy material.

For example, when NiTaC-13 is cast and directionally solidified about a core made of yttria ($Y_2O_3$) a layer of double oxides of $Y_3Al_5O_{12}$, $YAlO_3$ and $Y_4Al_2O_9$ is formed at the metal-ceramic interface. Initially the chemical reaction occurring will have a negative free energy and continue to occur. However, with the increase of yttrium in solution in the NiTaC-13 melt the free energy becomes less negative, and the chemical reaction less likely to continue. Eventually, the chemical reaction substantially ceases as enough yttrium has been dissolved and the chemical reaction reaches chemical equilibrium.

Therefore, a small amount of the rare earth metal comprising the ceramic of the core and/or mold is added to the eutectic alloy or superalloy material. An amount, preferably of the order of less than 3 weight percent, and preferably less than 1 weight percent, of the suitable rare earth metal, has been found sufficient to dope the eutectic alloy or superalloy material to substantially eliminate the reaction layer formed at the metal ceramic interface without deleteriously affecting the integrity of the cast metal. This enables the use of the following core and mold materials for directional solidification of superalloys such as NiTaC-13:

| Mold & Core Material | Dopant or Metal Addition |
|---|---|
| $Y_2O_3$ | Y |
| $Sm_2O_3$ | Sm |
| $Nd_2O_3$ | Nd |
| $Gd_2O_3$ | Gd |
| $Dy_2O_3$ | Dy |
| $Er_2O_3$ | Er |
| $Yb_2O_3$ | Yb |

However, care must be exercised that less than 1% by weight of the core or mold material is free, or bonded, silica. Preferably, the silica content should be less than 0.5% by weight. It is imperative that the silica content be minimized because rare earth metals such as yttrium have a very high chemical affinity for silica at 1600° C. and above. Even if silica is present in the mullite form in an alumina-silica mold, rare earth metals such as yttrium can react with the silica phase and produce an undesirable reaction layer at the mold-metal and/or core-metal interface. The resulting rare earth silicates formed at the mold-metal or core-metal interface would prevent the production of commercial quality directionally solidified castings of superalloy materials. Additionally, should an alumina barrier layer be formed at the mold-metal, or core-metal interface, the surface of the casting would be unacceptable for commercial applications. Therefore, the addition of the rare earth metal to alloy to be cast prevents the formation of undesirable mixed oxide layer at the interface.

One has to remember, however, that the silica content of the mold or core cannot exceed the limits previously stated (<1.0% by weight and preferably <0.5% by weight). Rare earth doped superalloy material cast in contact with molds and/or core materials of alumina-silica compositions has resulted in metal-mold reactions so severe as to cause surface defects in the castings thereby negating their commercial use.

In order to illustrate the teachings of this invention, several crucibles and rods of $Y_2O_3$ were manufactured. Each crucible was approximately 1 inch in diameter and approximately 3 inches in length. Each rod was approximately 3/16 inch in diameter and approximately 3 inches in length. Each of the crucibles and rods was made by isostatic compression at 30,000 psi followed by sintering for 1 hour at 1800° C.±50° C.

EXAMPLE I

A eutectic alloy composition, NiTaC-13 was prepared to which 0.5 weight percent of yttrium was added. The nominal composition of NiTaC-13, in weight percent, as prepared was:

| | | | |
|---|---|---|---|
| Nickel | 63.4% | Rhenium | 6.2% |
| Chromium | 4.4% | Vanadium | 5.6% |
| Cobalt | 3.3% | Tantalum | 8.1% |
| Aluminum | 5.4% | Carbon | 0.48% |
| Tungsten | 3.1% | | |

The material composition was melted and cast in a copper mold.

One $Y_2O_3$ crucible was placed in a controlled atmosphere furnace. A $Y_2O_3$ rod was mounted vertically in the crucible and extended upwardly therefrom axially aligned with a hole in a second $Y_2O_3$ crucible mounted directly over the first crucible and rod to complete the assembly.

No binding material was employed in making the crucible and the rod. The cast alloy of NiTaC-13+0.5 wt. % yttrium was placed in the upper crucible.

The assembly was heated in the controlled atmosphere furnace to 1800° C.±20° C. and held at the elevated temperature for 20 hours. The atmosphere in the furnace was flowing argon gas passed through a gettering furnace to remove oxygen. During heating the cast metal alloy is melted and flowed through the hole in the second crucible into the bottom crucible and around the $Y_2O_3$ rod. After 20 hours, the furnace was cooled, the assembly removed from the furnace and sections orthogonal to the rod were prepared for examination by optical microscopy and electron microprobe analysis.

With reference to the FIGURE, optical microscopy examination reveals an irregular and discontinuous reaction layer approximately 1 micron in thickness formed within approximately 0.2 micron of the metal-ceramic interface. The material composition of the reaction layer was $Y_4Al_2O_9$ as determined by microprobe analysis. The reaction layer was separated from the metal by a layer of $Y_2O_3$ approximately 0.2 microns in thickness. Many portions of the metal-ceramic interface when examined did not contain a reaction layer. The surface of the casting was of commercial quality.

EXAMPLE II

As a control experiment and to verify prior findings, the experiment of Example I was repeated except that the material composition of NiTaC-13 was not doped with yttrium.

Optical examination of the sections clearly revealed a continuous metal-ceramic interfacial reaction layer approximately 30 microns in thickness. A microprobe analysis of the reaction layer identified the material as being comprised of $Y_3Al_5O_{12}$, $YAlO_3$ and $Y_4Al_2O_9$. The surface of the casting was not of the same quality as the casting surface in Example I.

As indicated from the results of Example I the addition of 0.5 wt. % yttrium to the NiTaC-13 alloy composition does have beneficial affects when the core and/or mold material is made of $Y_2O_3$ ceramic material. The addition of 0.5 weight percent yttrium reduced an ~30μ reaction layer, which was continuous, to a non-continuous reaction layer of approximately 1 micron thickness. Two of the three phases present in the continuous layer are not found in the discontinuous layer. The discontinuous layer is also probably easily removed from the metal-ceramic interface by an autoclave caustic leaching process.

I claim as my invention:

1. A method for minimizing the formation of a reaction layer at the metal-ceramic interface when casting and directionally solidifying a superalloy material comprising the process steps of:
    (a) preparing a melt of a superalloy material;
    (b) adding a rare earth metal which is one selected from the group consisting of Y, Sm, Nd, Gd, Dy, Er and Yb as a dopant material to the superalloy material;
    (c) casting the doped superalloy material in contact with a ceramic oxide material whose metal cation is the same rare earth metal present as a dopant material in the superalloy material, the ceramic material containing less than 1 percent by weight silica, and
    (d) solidifying the cast metal while the metal is still in contact with the ceramic oxide material.

2. The method of claim 1 wherein
the amount of dopant material added to the superalloy material is less than 3 weight percent.

3. The method of claim 2 wherein
the dopant material is Y.

4. The method of claim 2 wherein
the amount of dopant material is less than 1 weight percent.

5. The method of claim 4 wherein
the dopant material is Y.

6. The method of claim 5 wherein
the superalloy material is NiTaC-13 having a nominal composition by weight percent of

| Nickel | 63.4 |
| Chromium | 4.4 |
| Cobalt | 3.3 |
| Aluminum | 5.4 |
| Tungsten | 3.1 |
| Rhenium | 6.2 |
| Vanadium | 5.6 |
| Tantalum | 8.1 |
| Carbon | 0.48 |

7. The method of claim 3 wherein
the superalloy material is NiTaC-13 having a nominal composition by weight percent of

| Nickel | 63.4 |
| Chromium | 4.4 |
| Cobalt | 3.3 |
| Aluminum | 5.4 |
| Tungsten | 3.1 |
| Rhenium | 6.2 |
| Vanadium | 5.6 |
| Tantalum | 8.1 |
| Carbon | 0.48 |

* * * * *